(12) United States Patent
Beaman et al.

(10) Patent No.: US 7,172,431 B2
(45) Date of Patent: Feb. 6, 2007

(54) ELECTRICAL CONNECTOR DESIGN AND CONTACT GEOMETRY AND METHOD OF USE THEREOF AND METHODS OF FABRICATION THEREOF

(75) Inventors: Brian S. Beaman, Apex, NC (US); George Liang-Tai Chiu, Croos River, NY (US); Keith Fogel, Nanuet, NY (US); Paul A. Lauro, Browster, NY (US); Daniel P. Morris, Purchase, NY (US); Da-Juan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/928,473

(22) Filed: Aug. 27, 2004

(65) Prior Publication Data

US 2006/0046528 A1    Mar. 2, 2006

(51) Int. Cl.
*H01R 12/00* (2006.01)
(52) U.S. Cl. .......................................... 439/66; 439/71
(58) Field of Classification Search ................. 439/66, 439/71; 228/206, 2.1
See application file for complete search history.

(56) References Cited

U.S. PATENT DOCUMENTS 4,686,857 A * 8/1987 Kato ......................... 73/304 R
4,788,496 A * 11/1988 Maelzer et al. ............ 324/754
4,949,224 A * 8/1990 Yamamura et al. ......... 361/784
4,963,822 A * 10/1990 Prokopp ..................... 324/758

(Continued)

FOREIGN PATENT DOCUMENTS

WO    WO 98/11449    3/1998

OTHER PUBLICATIONS

U.S. Appl. No. 09/254,769, filed Mar. 11, 1999, Lauro et al. Title: Wafer Scale High Density Probe Assembly, Apparatus For Use Thereof And Methods of Fabrication Thereof.

(Continued)

*Primary Examiner*—Ross Gushi
*Assistant Examiner*—Larisa Tsukerman
(74) *Attorney, Agent, or Firm*—Gibb I.P. Law Firm, LLC; Todd M. C. Li, Esq.

(57) ABSTRACT

A probe or an electrical connector comprises a substrate with a surface having a plurality of electrical contact locations. A shaped elongated electrical conductor has a first end coupled to one of the electrical contact locations and a second end thereof which projects away from the electrical contact location and through an aperture in a sheet of material. The sheet is disposed to be spaced apart from the surface of the substrate. At the second end of the elongated electrical conductor there is a tip structure, which is larger than the aperture in the sheet of material. The tip structure has a pointed portion thereof. The tip structure is disposed against contact locations of a contact surface. The electronic structure is moved towards the contact surface permitting the tip structure to penetrate into the surface of the electrical contact location thereon and to move, wipe, or vibrate across the surface thereof as the shaped elongated electrical conductor flexes as a result of being compressed by the movement of the electronic structure toward the contact surface.

20 Claims, 6 Drawing Sheets

U.S. PATENT DOCUMENTS

| | | | |
|---|---|---|---|
| 5,225,777 A * | 7/1993 | Bross et al. | 324/754 |
| 5,399,982 A * | 3/1995 | Driller et al. | 324/754 |
| 5,404,282 A * | 4/1995 | Klinke et al. | 362/249 |
| 5,531,022 A | 7/1996 | Beaman et al. | |
| 5,821,763 A | 10/1998 | Beaman et al. | |
| 6,024,579 A * | 2/2000 | Bennett | 439/66 |
| 6,054,651 A | 4/2000 | Fogel et al. | |
| 6,062,879 A | 5/2000 | Beaman et al. | |
| 6,104,201 A | 8/2000 | Beaman et al. | |
| 6,255,832 B1 * | 7/2001 | Notohardjono et al. | 324/754 |
| 6,278,284 B1 * | 8/2001 | Mori et al. | 324/755 |
| 6,286,208 B1 | 9/2001 | Shih et al. | |
| 6,292,003 B1 * | 9/2001 | Fredrickson et al. | 324/754 |
| 6,295,729 B1 | 10/2001 | Beaman et al. | |
| 6,329,827 B1 | 12/2001 | Beaman et al. | |
| 6,356,098 B1 * | 3/2002 | Akram et al. | 324/765 |
| 6,452,406 B1 | 9/2002 | Beaman et al. | |
| 6,528,984 B2 | 3/2003 | Beaman et al. | |
| 6,638,097 B2 * | 10/2003 | Wu et al. | 439/482 |
| 6,736,665 B2 * | 5/2004 | Zhou et al. | 439/482 |
| 6,825,422 B2 * | 11/2004 | Eldridge et al. | 174/260 |
| 6,869,289 B2 * | 3/2005 | Sabatier et al. | 439/66 |
| 6,920,689 B2 * | 7/2005 | Khandros et al. | 29/860 |
| 2002/0130164 A1 * | 9/2002 | Matsuki et al. | 228/206 |
| 2006/0113351 A1 * | 6/2006 | Ozaki et al. | 228/2.1 |

OTHER PUBLICATIONS

U.S. Appl. No. 08/756,831, filed Nov. 20, 1996, Lauro et al. Title: High Temperature Chip Test Probe.

* cited by examiner

ELECTRICAL CONNECTOR DESIGN AND CONTACT GEOMETRY AND METHOD OF USE THEREOF AND METHODS OF FABRICATION THEREOF

CROSS-REFERENCE TO RELATED APPLICATIONS

This application is related to the following patents and applications. U.S. application Ser. No. 09/254,769 filed on Mar. 11, 1999, which is the U.S. National Phase of International Application Ser. No. PCT/US97/16264 filed Sep. 12, 1997 (WIPO Publication No. WO 98/11449. Published on Mar. 19, 1998), which claims priority from U.S. Provisional Application Ser. No. 60/026,088 filed on Sep. 13, 1996. U.S. application Ser. No. 09/254,768 filed on Mar. 11, 1999, which issued as U.S. Pat. No. 6,528,984 B2 on Mar. 4, 2003 and which is the U.S. National Phase of International Application Ser. No. PCT/US97/16265 filed on Sep. 12, 1997, which claims priority from U.S. Provisional Application Ser. No. 60/026,112 filed on Sep. 13, 1996. U.S. application Ser. No. 09/254,798 filed on Mar. 11, 1999, which issued as U.S. Pat. No. 6,452,406 B1 on Sep, 17, 2002 and which is the U.S. National Phase of International Application Ser. No. PCT/US97/13698 filed on Sep. 12, 1997, which claims priority from U.S. Provisional Application Ser. No. 60/026,050 filed on Sep. 13, 1996. U.S. application Ser. No. 08/756,831 filed on Nov. 20, 1996, which is a Continuation of U.S. application Ser. No. 08/425,639 filed on Apr. 20, 1995 which is now abandoned. U.S. Pat. No. 5,821,763, U.S. Pat. No. 6,062,879, U.S. Pat. No. 6,295,729, U.S. Pat. No. 6,329,827, U.S. Pat. No. 6,286,208, U.S. Pat. No. 6,054,651, U.S. Pat. No. 6,104,201, U.S. Pat. No. 5,531,022, US Patent. All of the above are incorporated herein by reference.

BACKGROUND OF THE INVENTION

1. Field of the Invention

The present invention is directed to structures/methods of use thereof, and methods of fabrication thereof for electrically interconnecting structures to integrated circuit devices and other electronic components and particularly to testing of integrated circuit devices with rigid interconnection pads and devices incorporating the electrical interconnection structures.

2. Description of the Related Art

Integrated circuit (IC) devices and other electronic components are normally tested to verify the electrical function of the device and certain devices require high temperature burn-in testing to accelerate early life failures of these devices. Wafer probing is typically done by step-and-repeat sequentially on each single chip site at temperatures ranging from 25° C.–125° C. while burn-in is typically done on diced and packaged chips at temperatures ranging from 80° C. to 150° C. Wafer probing and IC chip burn-in at elevated temperatures of up to 200° C. has several advantages and is becoming increasingly important in the semiconductor industry. Simultaneous testing of multiple chips on a single wafer has obvious advantages for reducing costs and increasing production throughput and is a logical step towards testing and burn-in of an entire wafer.

The various types of interconnection methods used to test these devices include permanent, semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect the IC device to a substrate with fan out wiring or directly to the test equipment.

The permanent attachment techniques used for testing integrated circuit devices, such as wire bonding to a lead frame of a plastic leaded chip carrier, are typically used for devices that have a low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques used for testing integrated circuit devices, such as solder ball attachment to a ceramic or plastic pin grid array package, are typically used for devices that have a high number of interconnections and the pin grid array package is relatively expensive. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to probe sockets that are directly connected to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This type of probe is also much larger than the IC device that is being tested and the use of this type of probe for high temperature testing is limited by the probe structure and material set.

Another technique used for testing IC devices comprises a thin flex circuit with metal bumps and fan out wiring. The bumps are typically formed by photo lithographic processes and provide a raised contact for the probe assembly. The bumps are used to contact the flat or recessed aluminum bond pads on the IC device. An elastomer pad is typically used between the back of the flex circuit and a pressure plate or rigid circuit board to provide compliance for the probe interface. This type of probe is limited to flexible film substrate materials that typically have one or two wiring layers.

The position of the tips must be controlled to ensure accurate alignment of the probes to the interconnection pads on the IC device. During high temperature burn-in testing, the thermal expansion mismatch between the probe structure and the IC device must be small to ensure that the probe position does not vary significantly over the burn-in temperature range. Thermal expansion mismatch within the probe structure can result in contact reliability problems.

The challenges of probing (or electrically connecting to) a single high density integrated circuit device are further multiplied for multi-chip and full wafer testing applications. Probe fabrication techniques and material selection are critical to the thermal expansion and contact alignment considerations. A small difference in the thermal expansion of the substrate, wafer, and probe construction will cause misalignment of the probe tip to the contact pads on the wafer. Compliance of the probe structure is another critical factor. Slight variations in the wafer metallization, passivation, warpage of the wafer, and slight variations in the probe height contribute to the total compliance requirements for the probe structure.

SUMMARY OF THE INVENTION

A broad aspect of the present invention is an electronic structure, for example useful as a probe or an electrical connector to an electronic device, such as, an integrated circuit chip or a packaging substrate for an integrated circuit device. The electronic structure of the present invention comprises a substrate with a surface having a plurality of electrical contact locations. A shaped elongated electrical conductor has a first end coupled to one of the electrical contact locations, and a second end thereof which projects away from the electrical contact location and through an aperture in a sheet of material. The sheet is disposed to be spaced apart from the surface of the substrate. At the second end of the elongated electrical conductor there is a tip structure, which is larger than the aperture in the sheet of material. The tip structure has a pointed portion thereof. When the electronic structure of the present invention is used as a probe or electrical connector, the tip structure is disposed against contact locations of a contact surface (e.g., aluminum bond pads of the device being tested), for example, on the surface of an electronic device. The electronic structure is moved towards the contact surface permitting the tip structure to penetrate into the surface of the electrical contact location thereon and to move, wipe, or vibrate across the surface thereof as the shaped elongated electrical conductor flexes as a result of being compressed by the movement of the electronic structure toward the contact surface.

The apertures in the sheet through which the flexible elongated electrical conductors project provide a number of features. For example, the aperture opening has a dimension to prevent the tip structure from moving off the surface of the electrical contact location on the contact surface. The sheet can have a material composition that has a thermal coefficient of expansion (TCE) substantially matched to the TCE of the contact substrate so that when the combination of the electronic structure disposed against the contact surface is thermally cycled during use thereof, the tip structures are held in the correct position relative the electrical contact locations of the contact surface.

When there are a large number of flexible elongated electrical conductors the total force that must be applied to the electronic structure for the tip structures to sufficiently penetrate the surface of the electrical contact locations on the contact surface may be too large to avoid damage to the electronic structure. To avoid this damage, the tip structure can be vibrated, (preferably ultrasonically and preferably in the lateral and orthogonal directions separately or in combination, with respect to the contact surface) so that the tip structure penetrates the surface with less than the applied force that would be necessary without this vibration. The tip can, for example, be vibrated by vibrating the substrate having the elongated electrical conductors, by vibrating the contact substrate when the tips are in contact with the contract locations thereon, and by vibrating the sheet of material with respect to the contact surface.

Another broad aspect of the present invention is an electronic structure, for example useful as a probe for an electrical connector to an electronic device, such as, an integrated circuit chip or a packaging substrate for an integrated circuit device. The electronic structure of the present invention comprises a substrate with a surface having a plurality of electrical contact locations, there being a shaped elongated electrical conductor having a first end coupled to one of the electrical contact locations and a second end thereof which projects away from the electrical contact location. When the electronic structure of the present invention is used as a probe or electrical connector, the tip structure is disposed against contact locations of contact surface, for example, on the surface of an electronic device. The contact locations of the contact surface have a generally concave structure so that there is a pit-like texture to the surface thereof. The shape of the pit channels (the second end disposed in contact therewith towards the central location of the pit-like structure) substantially prevents the second end from traveling off the surface of the contact location. The central location of the pit-like structure is preferably a non-oxidizable material, for example, gold. The second end has a non-ozidizable tip, for example gold, permitting good electrical contact of the tip to the central location. The pit like structure can be sacrificial so that it is easily removable.

It is a property of the present invention to provide a probe for testing integrated circuit devices and other electronic components that use rigid bond pads for the interconnection means. Another property of the present invention is to provide a probe with a compliant interface to compensate for slight variations in the rigid bond pad heights on the IC device and variations in the height of the probe contacts. A further property of the present invention is to provide a raised probe tip for contacting recessed surfaces on the IC device. An additional property of the present invention is to provide a probe construction that has thermal expansion characteristics that are matched to the device to be tested or burned-in at high temperature.

Yet another property of the present invention is to provide a probe construction that has high durability and reliability for repeated thermal and mechanical cycling. A further additional property of the present invention is to provide a probe structure that can be used for single chip or multiple chip wafer testing. Another property of the present invention is to provide a probe structure that has a hardened, pointed contact tip for penetrating the oxide films on the bond pads of IC devices.

The invention provides an improved electrical interconnection structure; test structure and test apparatus that utilizes compliant test elongated electrical conductor to make and maintain contact with electrical contact locations, e.g. bond, on the device to which electrical connection is made or being tested even if the bond pads are not all the same height. The invention provides a hardened point on the contact tip that is preferably made of a material that cannot be easily oxidized, and that has sufficient hardness to break through any oxidation that has accumulated on the bond pads. The invention preferably vibrates the tips to allow the hardened contact points to move back and forth across the electrical contact location, thereby further promoting the ability of the hardened contact points to break through any oxidation on the surface material such as electrical contact locality. Further, the invention provides slotted alignment sheets that maintain the compliant elongated electrical conductor in the proper position to remain in contact with the electrical contact locations even as the compliant elongated electrical conductors are being vibrated and pressed against the bond pads. Thus, the improved structure described above provides a number of significant advantages by providing test probes and electrical connectors that are compliant and can vibrate to break through any surface oxide on the contact location yet are positionally stable so as to remain in contact with the contact location. This allows many contact locations on one or more devices to be electrically contacted or tested with a single test device or connector structure which prevents individual elongated electrical conductors from disconnecting from their associated electrical contact locators and promotes many efficiencies with respect to electrically connecting to and testing integrated circuit devices.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

While many examples discussed below relate to test probes used with a testing device, one ordinarily skilled in the art would readily understand that this is only one example in which the invention finds application and that the invention is not limited to test structures and testing devices. To the contrary, the invention is broadly applicable to any kind of electrical connection, temporary or permanent, made between two or more devices. Therefore, the following embodiments are only examples of the invention that can be used and are not intended to limit the environments in which the invention can find application. What is referred to as a test structure or apparatus, etc. probe herein can be used as an electrical connector device, for example to form an electric package of an integrated circuit chip and a packaging substrate. A probe tip can be an electrical connector tip. A test structure or apparatus can be a packaging structure apparatus. A probe can be an electrical connector.

Figure 1:
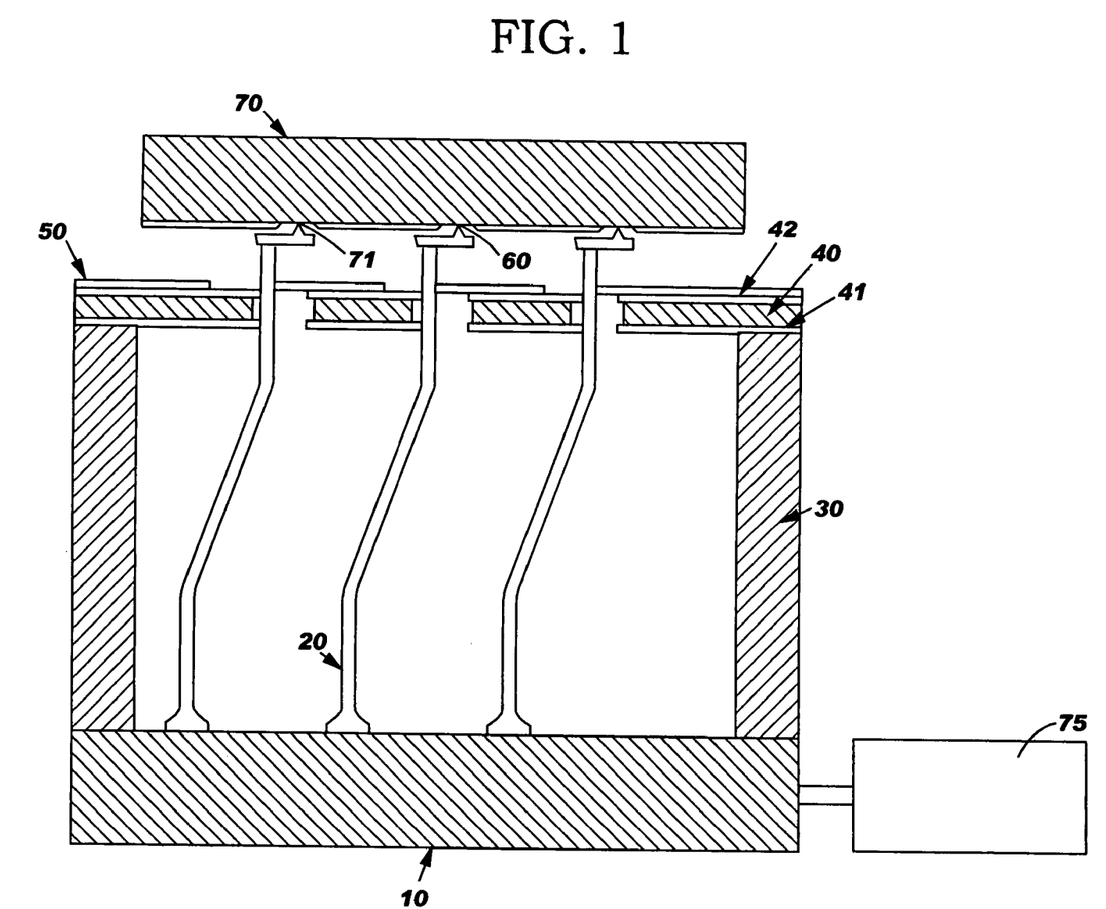
FIG. 1 shows a cross section of a preferred embodiment of the present invention aligned with the bond pads on an integrated circuit device.

FIG. 1 shows a cross section of a preferred embodiment of the compliant test probes/electrical connectors (20) with enhanced contact tips (60) aligned with the bond pads (71) on an integrated circuit device (70). A vibrator (75) is connected to the substrate with the purpose of vibrating the test probes (20). As would be understood by one ordinarily skilled in the art, the vibrator (75) could be connected to the any appropriate portion of the test apparatus in order to cause vibration of the test probes. The test probes (20) are attached to a fan out test substrate (10) that provides a means of connecting the high density probes to the equipment used to electrically test the integrated circuit device (70). The test probes comprise free-standing, self-supported, and conductive structures that are shaped to allow the test probes to bend or compress when placed in contact with the bond pads (71) of the device being tested (70). Therefore, and shown in FIGS. 1–5, the test probes (20) include two or more bends that allow the height of the test probe to change as pressure is placed upon the contact tip (60). However, as would be understood by one ordinarily skilled in the art, a number of different shapes could be utilized to allow the height of the test probe to change as a pressure is placed upon the contact tip (60). The fan out substrate (10) can be made from various materials and constructions including single and multi-layer ceramic with thick or thin film wiring, silicon wafer with thin film wiring, or epoxy glass laminate construction with high density copper wiring. The test probes (20) on the substrate are accurately positioned with an alignment mask (40). The compliant frame (30) allows the test probes (20) and alignment mask (40) to compress without effecting the contact pressure of the enhanced tips (60) against the bond pads (71) on the IC device (70).

Figure 2:
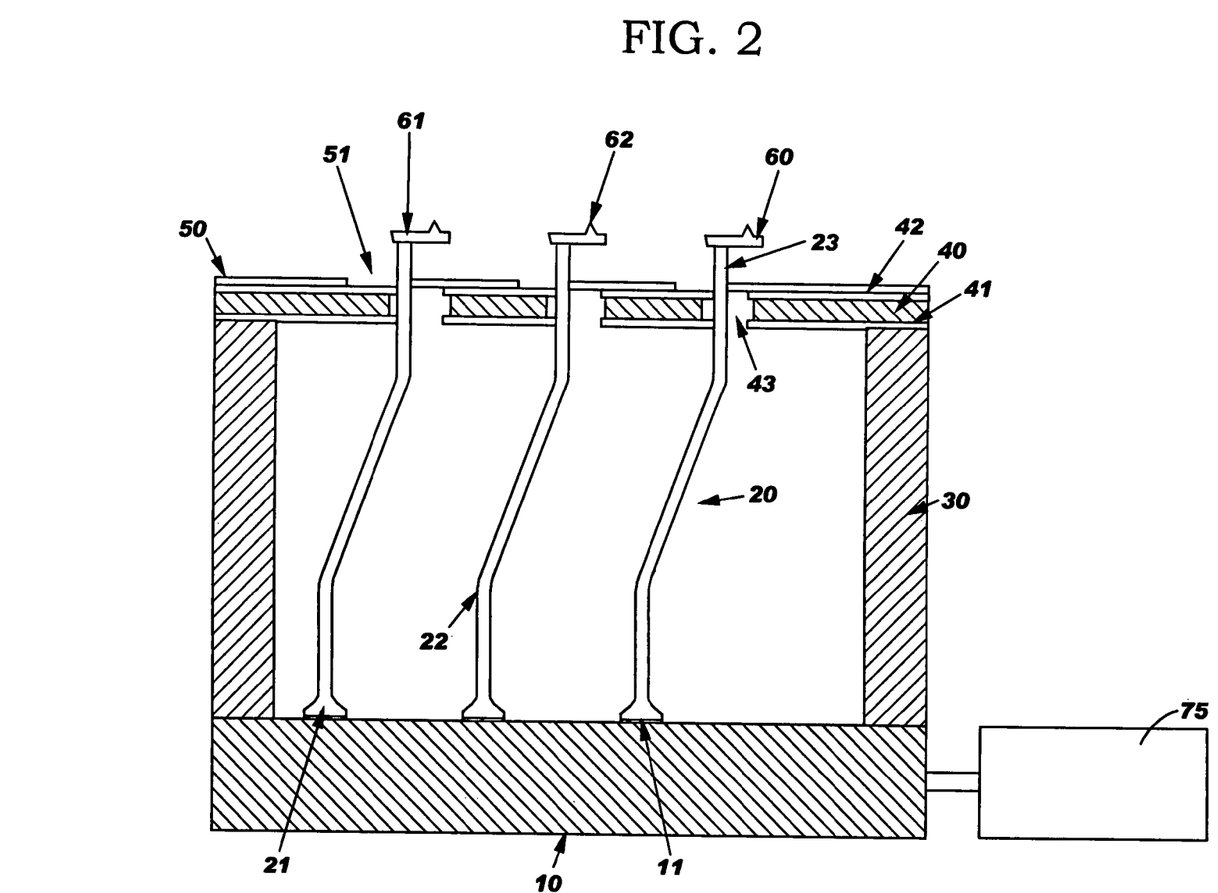
FIG. 2 shows another cross section of a preferred embodiment of the present invention.
Figure 3:
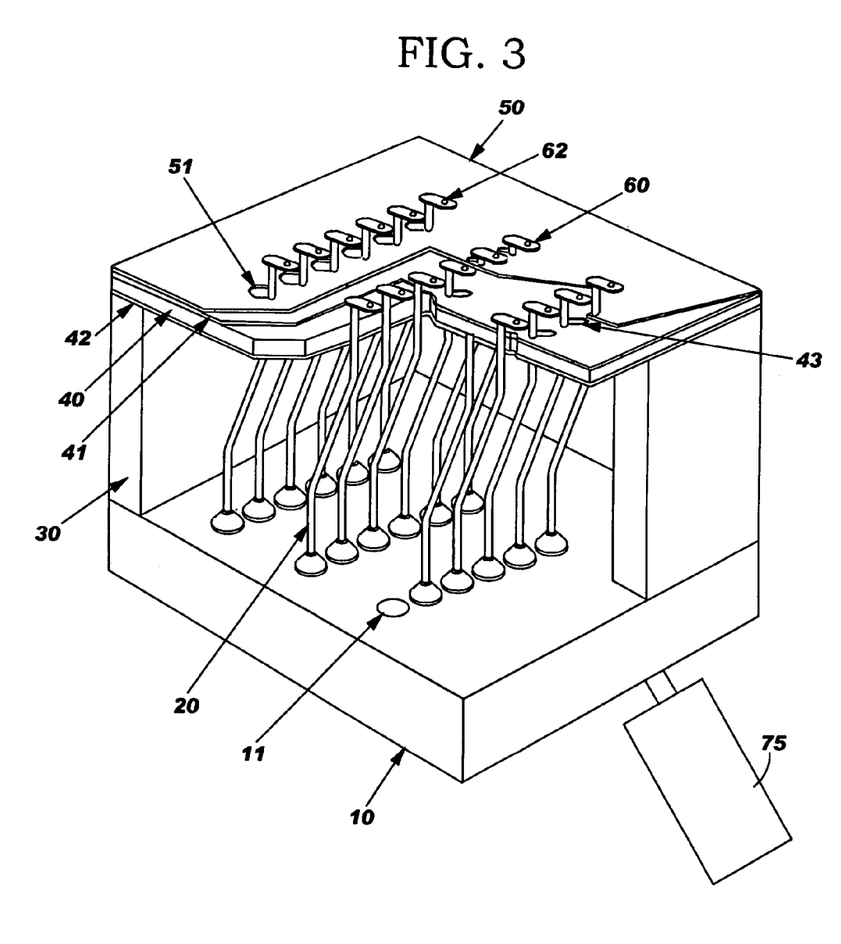
FIG. 3 shows an isometric view of a preferred embodiment of the present invention with a section cut away for visualization purposes.

The alignment mask (40) shown in FIG. 1 and FIG. 2 is made from a thin sheet of metal (e.g., of Invar, Copper/Invar/Copper, Molybdenum, Tungsten, Copper, Tantalum or Titanilum, etc.) coated on both sides with thin layers of insulator (e.g., polyimide) material (41, 42) to electrically isolate each of the plurality of wire probes (20). Alternatively, instead of using metal for the thin sheet 40, an insulator (such as silicon, Vespal, Melcor, machineable polyimides, ceramics, quartz, etc.) can be used depending upon the specific types of devices that will be tested with the inventive structure. For example, by using a thickness ratio of 2:6:2 of the Polyimide:Invar:Polyimide layers, the sandwiched layer was measured to have a thermal expansion coefficient (TEC) of 3 ppm/° C. that closely matches that of the semiconductor wafer (70). The diameter of the holes in the thin Invar sheet (40) are slightly larger than the holes in the polyimide layers (41, 42) to prevent the ends of the probe wires (23) from shorting to the thin Invar sheet (40). For example, the holes in the Invar sheet (40) can be created using a precision chemical etching process while the holes in the polyimide layers (41, 42) are created using an excimer laser ablation process to create the differently sized holes.

The thin Invar sheet (40) with the thin layers of polyimide (41, 42) matches the thermal expansion coefficient (TCE) of silicon to 250° C. If the test temperature is lower than 100° C., other types of metal sheet, such as molybdenum, or non-metal sheet of materials, such as Vespal, Melcor, or ceramics can all be used as the restraining layer. As would be understood by one ordinarily skilled in the art, other materials could be used to test other types of structures. The materials would be selected to allow the test structure to have a similar coefficient of thermal expansion as the device being tested or the device being connected to and to prevent the alignment mask from shorting against the test probes. Thus, as mentioned above, the embodiments discussed herein are only examples of the invention and this disclosure is intended to cover all similar structures/methods.

A separate sheet of polyimide (50) (also shown in FIG. 2 and FIG. 3) is used to further restrict the ends of the probe wires (23) and ensure accurate alignment of the probes (20) to the bond pads on the IC device. The openings 43, 51 in the polyimide layers 41, 42 can comprise slotted openings (holes). The slotted holes (43) in the polyimide layers (41, 42) attached to the Invar sheet (40) are created with one end having a large opening and the opposite end having a smaller opening. The slotted holes (51) in the polyimide alignment sheet (50) are similar in shape to the slotted holes (43) in the thin polyimide layers (41, 42) but are aligned with the smaller opening in an opposing orientation. These opposing slotted openings 43, 51 maintain the probes 20 in position.

Enhanced contact tips (60) are attached to the ends of the probe wires (23) using, for example, solder connections (61) as shown in FIG. 2. The contact tips (60) can be formed from a thin silicon wafer and are selectively etched to form a raised contact point (62). The raised contact point (62) provides a hardened feature on the end of the probe to facilitate penetration of the oxides on the bond pads of the IC device being tested. The surfaces of the contact tips (60) are plated with a noble metal such as gold, platinum, or palladium. This prevents the contact point 62 and contact tips 60 from oxidizing. In addition, the bonding pads on the device being tested (e.g., such as aluminum bonding pads) can also be plated with a noble metal to prevent oxidation of the bonding pads on the device being tested. The bonding pads on the device can be disposable.

Figure 4:
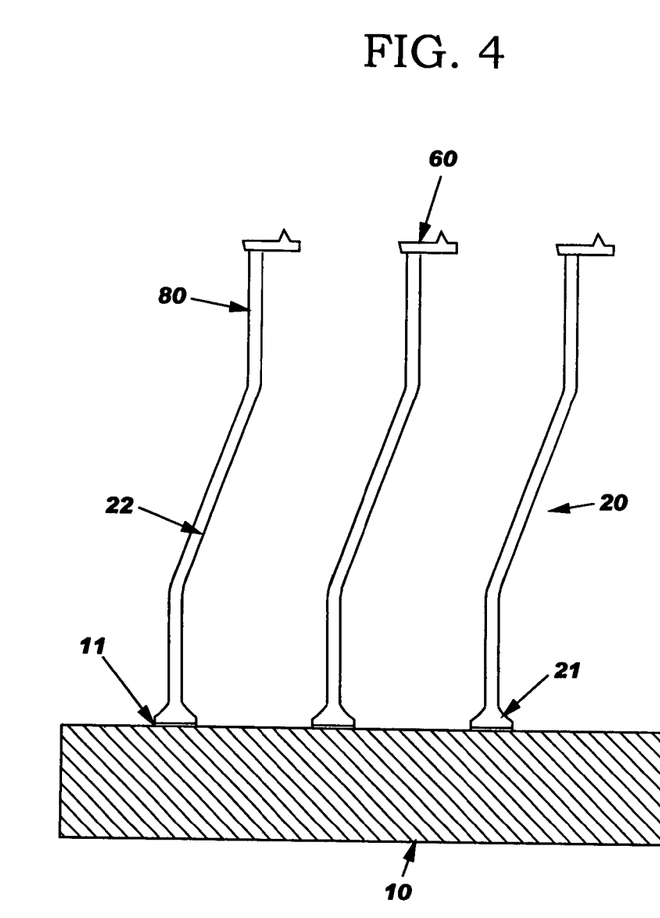
FIG. 4 shows a simplified cross section of just a preferred embodiment after an over plating process.

FIG. 4 shows a simplified cross section of just the test probe (20) after an over plating process. The process is used to electroplate a layer of metal (80) over the test probe (20). The over plating (80) covers the bond pad (11), ball bond (21), bond wire (22), and the contact tip (60). The over plating material is selected from various metals and metal alloys including Ni—Pd, Co—Pd, Pt, Pd, Pt/Au and Pd/Au and is used to increase the modulus of the test probe structure and thereby increase its durability through repeated thermal cycling.

Figure 5:
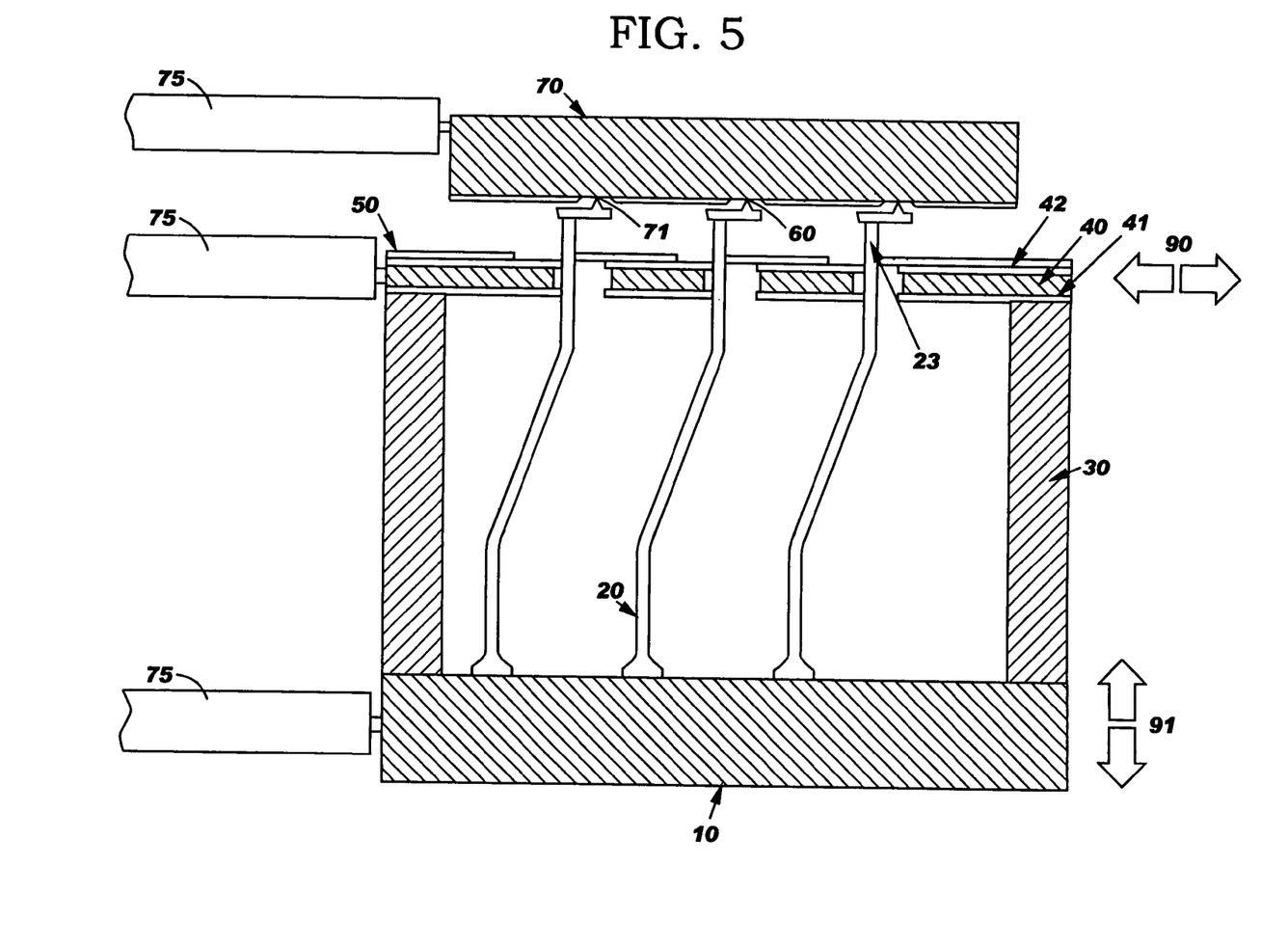
FIG. 5 shows a cross section of a preferred embodiment aligned with the bond pads on an integrated circuit device and ultrasonic energy applied to the alignment mask.

FIG. 5 shows a cross section of the compliant test probes (20) with enhanced contact tips (60) aligned with the bond pads (71) on an integrated circuit device (70). As shown in FIG. 5, one or more vibrators (75) can be utilized to apply ultrasonic energy to one or more of the structures. Ultrasonic energy (90) is applied to the alignment mask (40) and transferred to the end of the test probe (23). The ultrasonic energy (90) causes the enhanced contact tips (60) of the test probes (20) to vibrate and penetrate the layer of oxide on the surface of the bond pads (71) on the IC device (70) being subjected to testing. The ultrasonic energy (90) can alternatively or also be applied to other part of the test probe hardware such as the substrate (10) or the frame (30) or it can be applied to the IC device (70). The ultrasonic energy (90, 91) can be applied to different axis of the test probe hardware to further enhance penetration of the oxide on the surface of the bond pads (71).

Figure 6:
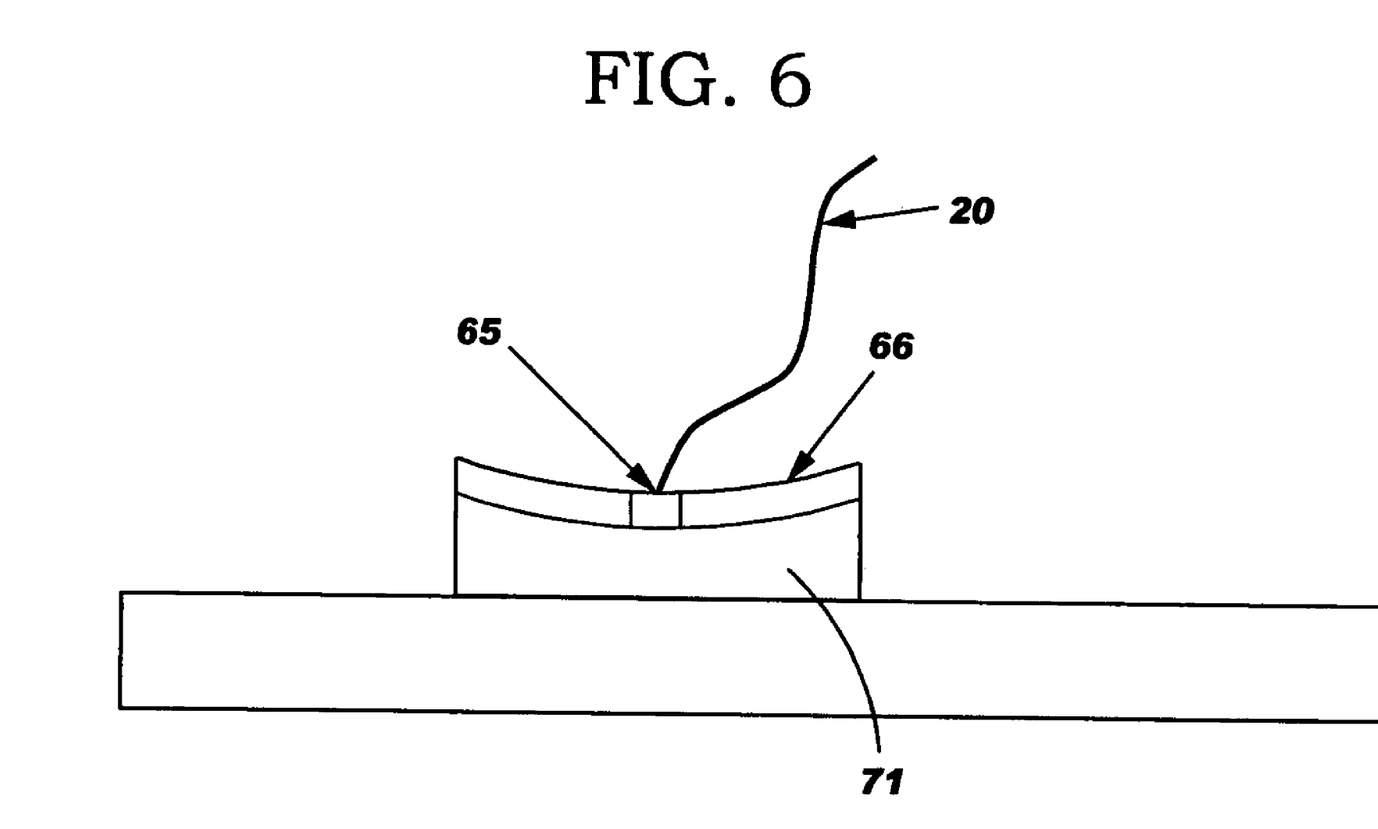
FIG. 6 shows a cross section of a bond pad according to the invention.

As shown in FIG. 6, when the electronic structure of the present invention is used as a probe or electrical connector (20), the tip structure (20) is disposed against contact locations (e.g., bond pad (71)) or contact surface, for example, on the surface of an electronic device. The bond pads (71) have a generally concave shape (66) so that there is a pit-like texture to the surface thereof. The concave shape of the bond pads (71) substantially prevents the electrical probe (20) from traveling off the central location (65) of the surface of the bond pad (71). The central location 65 of the pit-like structure is preferably a non-oxidizable material, for example, gold. The electrical connector (20) similarly has a non-oxidizable tip (62), for example gold, permitting good electrical contact of the electrical connector (20) to the central location (65). The pit like bond pad structure (71) can be sacrificial so that it is easily removable.

As shown above, the invention provides an improved test apparatus/connection device that utilizes compliant test probes (20) to make and maintain contact with bond pads (71) on the device being tested (70) even if the bond pads (71) are not all the same height. The invention provides a hardened point (62) on the contact tip (60) that is preferably made of a material that cannot be easily oxidized, and that has sufficient hardness to break through any oxidation that has accumulated on the bond pads (71). The invention vibrates the test probes (20) to allow the hardened contact points (62) to move back and forth across the bond pads (71), thereby further promoting the ability of the hardened contact points (62) to break through any oxidation on the bond pads (71). Further, the invention provides slotted alignment sheets (40, 42, 50) that maintain the compliant test probes (20) in the proper position to remain in contact with the bond pads (71) even as the compliant test probes (20) are being vibrated and pressed against the bond pads (71). Thus, the improved structure described above provides a number of significant advantages by providing test probes that are compliant and can vibrate to break through any oxide on the bond pads, yet are positionally stable so as to remain in contact with the bond pads. This allows many bond pads on one or more integrated circuit devices to be tested or connected to with a single test device which prevents individual probes from disconnecting from their associated bond pads and promotes many efficiencies with respect to testing integrated circuit devices.

While the described a preferred embodiments of the invention, it will be understood that those skilled in the art, both now and in the future, may make various improvements and enhancements which fall within the scope of the claims which follow. These claims should be construed to maintain the proper protection for the invention first disclosed.

What is claimed is:

1. A structure for making electrical contact with a plurality of electrical contact locations comprising:
   a substrate;
   a plurality of compliant elongated conductors, wherein each of said compliant elongated conductors is attached at a first end to said substrate includes at a second end a contact tip adapted to form an electrical contact with a corresponding one of said electrical contact locations, and is adapted to bend to accommodate different heights of said electrical contact locations;
   an alignment sheet positioned above said substrate, wherein said alignment sheet includes a plurality of openings that are aligned with said electrical contact locations and through which said compliant elongated conductors extend; and a vibrator adapted to ultrasonically vibrate said contact tips with respect to said electrical contact locations when said contact tips are in contact with said electrical contact locations so that said contact tips penetrate an oxide on said electrical contact locations, wherein said alignment sheet maintains said compliant elongated conductors in a position to maintain contact with said electrical contact locations when said contact tips are vibrated and when said elongated conductors bend, wherein said vibrator is further adapted to vibrate said contact tips with a vibration in a direction, with respect to said electrical contact locations, that is selected from a group consisting of a lateral direction, an orthogonal direction and combination thereof so that said contact tips penetrate a surface of said electrical contact locations with less than an applied force that would be necessary without said vibration; and wherein said vibrator is further adapted to vibrate said contact tips with an action selected from a group consisting of vibrating said substrate, vibrating said contact locations and combinations thereof.

2. A structure according to claim 1, wherein the coefficient of thermal expansion of said alignment sheet substantially matches the coefficient of thermal expansion of a device supporting said electrical contact locations.

3. A structure for making electrical contact with a plurality of electrical contact locations comprising:

a substrate;

a plurality of compliant elongated electrical conductors having first ends attached to said substrate, wherein said elongated electrical conductors include second ends with contact tips adapted to form electrical contact with a corresponding one of said electrical contact locations;

an alignment sheet positioned above said substrate; and a vibrator adapted to vibrate said contact tips with respect to said electrical contact locations when said contact tips are in contact with said electrical contact locations so that said contact tips penetrate an oxide on said electrical contact locations, wherein said alignment sheet includes a plurality of openings that are aligned with said electrical contact locations and through which said elongated electrical conductors extend, and wherein said alignment sheet maintains said elongated electrical conductors in a position to maintain contact with said electrical contact locations when said contact tips are vibrated.

4. A structure according to claim 3, wherein said contact tips each include a contact point adapted to break through a surface layer on said electrical contact locations.

5. A structure according to claim 3, wherein said openings have a dimension, said second ends comprise free ends, said free ends each have a top structure, and said top structure has a size larger than said dimension.

6. A structure according to claim 3, wherein the coefficient of thermal expansion of said alignment sheet substantially matches the coefficient of thermal expansion of a device supporting said electrical contact locations.

7. A structure according to claim 3, wherein each of said elongated electrical conductors comprise a free-standing, flexible conductor adapted to bend sufficiently to maintain contact with electrical contact locations.

8. A structure according to claim 3, further comprising a compliant frame on said substrate and connected to said alignment sheet, wherein said compliant frame supports said alignment sheet above said substrate and allows said alignment sheet to compress as said compliant elongated electrical conductors bend when contacting said electrical contact locations.

9. The structure according to claim 3, wherein said vibrator is further adapted to ultrasonically vibrate said contact tips.

10. The structure according to claim 3, wherein said vibrator is further adapted to vibrate said contact tips with a vibration that is in a direction, with respect to said electrical contact locations, that is selected from a group consisting of a lateral direction, an orthogonal direction and combinations thereof so that said contact tips penetrate a surface of said electrical contact locations with less than an applied force that would be necessary without said vibration.

11. The structure according to claim 3, wherein said vibrator is further adapted to vibrate said contact tips with an action selected from a group consisting of vibrating said substrate. vibrating said alignment sheet, vibrating said contact locations and combinations thereof.

12. A structure for making electrical contact with a plurality of electrical contact locations on an electronic device, said test structure comprising:

a substrate;

a plurality of compliant elongated electrical conductors, wherein each of said compliant elongate conductors is attached at a first end to said substrate and includes at a second end a contact tip adapted to form electrical contact with a corresponding one of said electrical contact locations;

a first alignment sheet positioned above said substrate adjacent to said second end;

a second alignment sheet positioned above said first alignment sheet; and a vibrator adapted to vibrate said contact tips with respect to said electrical contact locations when said contact tips are in contact with said electrical contact locations so that said contact tips penetrate an oxide on said electrical contact locations, wherein said first alignment sheet and said second alignment sheet each include a plurality of corresponding slots that are aligned with said electrical contact locations and through which said elongated electrical conductors extend, and wherein said slots in said first alignment sheet are positioned to exert force against said elongated electrical conductors in a first direction and said slots in said second alignment sheet are positioned to exert force against said elongated electrical conductors in a second direction opposite to said first direction to maintain said elongated electrical conductors in a position to maintain contact with said electrical contact locations when said contact tips are vibrated.

13. A structure according to claim 12, wherein said contact tip includes a contact point adapted to break through a surface layer on said electrical contact locations, wherein said contact point comprises a noble metal.

14. A structure according to claim 12, wherein the coefficient of thermal expansion of said alignment sheet substantially matches the coefficient of thermal expansion of said electronic device.

15. A structure according to claim 12, wherein said elongated electrical conductors are coated with one or more of Ni, Pd, Pt, and Au.

16. A structure according to claim 12, wherein said electrical contact locations have a concave shape.

17. A structure according to claim 12, further comprising a compliant frame on said substrate and connected to said alignment sheet, wherein said compliant frame supports said alignment sheet above said substrate and allows said first alignment sheet and said second alignment sheet to compress as said compliant elongated conductors bend when contacting said electrical contact locations.

18. The structure according to claim 12, wherein said vibrator is further adapted to ultrasonically vibrate said contact tips.

19. The structure according to claim 12, wherein said vibrator if further adapted to vibrate said contact tips with a vibration that is in a direction, with respect to said electrical contact locations, that is selected from a group consisting of a lateral direction, an orthogonal direction and combinations thereof so that said contact tips penetrate a surface of said electrical contact locations with less than an applied force that would be necessary without said vibration.

20. The structure according to claim 12, wherein said vibrator is further adapted to vibrate said contact tips with an action selected from a group consisting of vibrating said substrate, vibrating said alignment sheet, vibrating said contact locations and combinations thereof.

* * * * *

UNITED STATES PATENT AND TRADEMARK OFFICE
CERTIFICATE OF CORRECTION

| | | |
|---|---|---|
| PATENT NO. | : 7,172,431 B2 | Page 1 of 1 |
| APPLICATION NO. | : 10/928473 | |
| DATED | : February 6, 2007 | |
| INVENTOR(S) | : Beaman et al. | |

It is certified that error appears in the above-identified patent and that said Letters Patent is hereby corrected as shown below:

On the title page item (75), replace the sixth inventor's name with the following name:

Da-Yuan Shih

Signed and Sealed this

Tenth Day of April, 2007

JON W. DUDAS
*Director of the United States Patent and Trademark Office*